US009233396B2

(12) United States Patent
Jeong

(10) Patent No.: US 9,233,396 B2
(45) Date of Patent: Jan. 12, 2016

(54) MICROMACHINED ULTRASONIC TRANSDUCER ARRAY

(71) Applicant: SAMSUNG ELECTRONICS CO., LTD., Suwon-si (KR)

(72) Inventor: Byung-gil Jeong, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 370 days.

(21) Appl. No.: 13/957,759

(22) Filed: Aug. 2, 2013

(65) Prior Publication Data

US 2014/0070669 A1 Mar. 13, 2014

(30) Foreign Application Priority Data

Sep. 13, 2012 (KR) ........................ 10-2012-0101804

(51) Int. Cl.

*H01L 41/09* (2006.01)
*B06B 1/06* (2006.01)
*B06B 1/02* (2006.01)

(52) U.S. Cl.

CPC ............. *B06B 1/0629* (2013.01); *B06B 1/0292* (2013.01)

(58) Field of Classification Search

CPC ............................ B06B 1/0292; B06B 1/0629
USPC ......... 310/336, 300, 334, 311, 309, 314, 317, 310/319, 322; 600/459, 643; 73/632, 625, 73/626; 29/594
See application file for complete search history.

(56) References Cited

U.S. PATENT DOCUMENTS

| | | | | |
|---|---|---|---|---|
| 8,345,508 | B2 * | 1/2013 | Wodnicki et al. | 367/7 |
| 2004/0261251 | A1 | 12/2004 | Schindel | |
| 2008/0213933 | A1 | 9/2008 | Fisher et al. | |
| 2010/0191108 | A1 * | 7/2010 | Sato | 600/437 |
| 2010/0280388 | A1 | 11/2010 | Huang | |
| 2011/0071397 | A1 * | 3/2011 | Wodnicki et al. | 600/459 |
| 2011/0316383 | A1 | 12/2011 | Machida et al. | |
| 2012/0118475 | A1 | 5/2012 | Baumgartner | |
| 2014/0069194 | A1 * | 3/2014 | Kim | 73/632 |

FOREIGN PATENT DOCUMENTS

| | | | |
|---|---|---|---|
| KR | 10-2004-0028630 | A | 4/2004 |
| KR | 10-2006-0050773 | A | 5/2006 |
| KR | 10-2011-0031406 | A | 3/2011 |

* cited by examiner

*Primary Examiner* — Thomas Dougherty
*Assistant Examiner* — Karen B Addison
(74) *Attorney, Agent, or Firm* — Sughrue Mion, PLLC

(57) ABSTRACT

A micromachined ultrasonic transducer (MUT) array includes a printed circuit board, an alignment plate formed on the printed circuit board, the alignment plate having a plurality of cavities formed therein and a plurality of protruding portions respectively formed between neighboring cavities of the plurality of cavities, and a plurality of MUT modules formed on the plurality of the cavities and the plurality of the protruding portions of the alignment plate. In the MUT array, each of the plurality of MUT modules includes an application-specific integrated circuit (ASIC) arranged on the alignment plate and an MUT arranged on the ASIC.

20 Claims, 4 Drawing Sheets

MICROMACHINED ULTRASONIC TRANSDUCER ARRAY

CROSS-REFERENCE TO RELATED APPLICATION

This application claims the benefit of Korean Patent Application No. 10-2012-0101804, filed on Sep. 13, 2012, in the Korean Intellectual Property Office, the disclosure of which is incorporated herein in its entirety by reference.

BACKGROUND

1. Field

The present disclosure relates to a micromachined ultrasonic transducer array, and more particularly, to a micromachined ultrasonic transducer array in which a dead zone is reduced during tiling of micromachined ultrasonic transducer modules so that uniformity in irradiation of an ultrasonic wave is improved.

2. Description of the Related Art

Micromachined Ultrasonic Transducers (MUTs) are devices for converting electrical signals to ultrasonic signals or vice versa. MUTs may be classified into a piezoelectric micromachined ultrasonic transducer (PMUT), a capacitive micromachined ultrasonic transducer (CMUT), a magnetic micromachined ultrasonic transducer (MMUT), etc., according to the type of a conversion method implemented by the MUT. The MUT is coupled with an application-specific integrated circuit (ASIC) including a drive circuit, forming an MUT module. An MUT array includes a plurality of MUT modules arranged in an array on a printed circuit board and is used in a medical diagnostic imaging system or a sensor.

In an MUT array, when MUT modules are arranged on the same plane, uniformity in irradiation of an ultrasonic wave may be reduced due to a dead zone between neighboring MUT modules and thus sensitivity in measuring an ultrasonic wave may be reduced.

SUMMARY

Provided is a micromachined ultrasonic transducer (MUT) array in which a dead zone between tiled MUT modules is reduced.

Additional aspects will be set forth in part in the description which follows and, in part, will be apparent from the description, or may be learned by practice of the exemplary embodiments.

According to an aspect of an exemplary embodiment, a micromachined ultrasonic transducer (MUT) array includes a printed circuit board, an alignment plate formed on the printed circuit board, the alignment plate having a plurality of cavities formed therein and a plurality of protruding portions respectively formed between neighboring cavities of the plurality of cavities, and a plurality of MUT modules formed on the plurality of the cavities and the plurality of the protruding portions of the alignment plate. In the MUT array, each of the plurality of MUT modules includes an application-specific integrated circuit (ASIC) arranged on the alignment plate and an MUT arranged on the ASIC.

The alignment plate may be formed of any one of silicon, polymer, and ceramic.

The MUT may be a capacitive micromachined ultrasonic transducer (CMUT) or a piezoelectric micromachined ultrasonic transducer (PMUT).

Each of the plurality of cavities may have a depth that is substantially the same as or greater than a thickness of the MUT.

Each of the plurality of cavities may have a depth that is substantially the same as a thickness of each of the plurality of MUT modules.

The plurality of MUT modules may include a plurality of first MUT modules arranged on the plurality of the cavities and a plurality of second MUT modules arranged on the plurality of the protruding portions, each of the second MUT modules may include a step portion formed by removing an edge portion of the ASIC, and an upper surface of each of the first MUT modules may be configured to fit into the step portion of a corresponding second MUT module of the second MUT modules.

Each of the first and second MUT modules may include an active region where a plurality of elements for detecting an ultrasonic wave area are arranged and a dead region surrounding the active region, and an upper surface of each of the plurality of protruding portions may have substantially the same size as the active regions of each of the second MUT modules.

According to another aspect of an exemplary embodiment, a micromachined ultrasonic transducer (MUT) array includes a printed circuit board having a plurality of cavities formed thereon and a plurality of protruding portions respectively formed between neighboring cavities of the plurality of cavities, and a plurality of MUT modules formed on the plurality of cavities and the plurality of protruding portions, wherein each of the plurality of MUT modules comprises an application-specific integrated circuit (ASIC) arranged on the printed circuit board and an MUT arranged on the ASIC.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
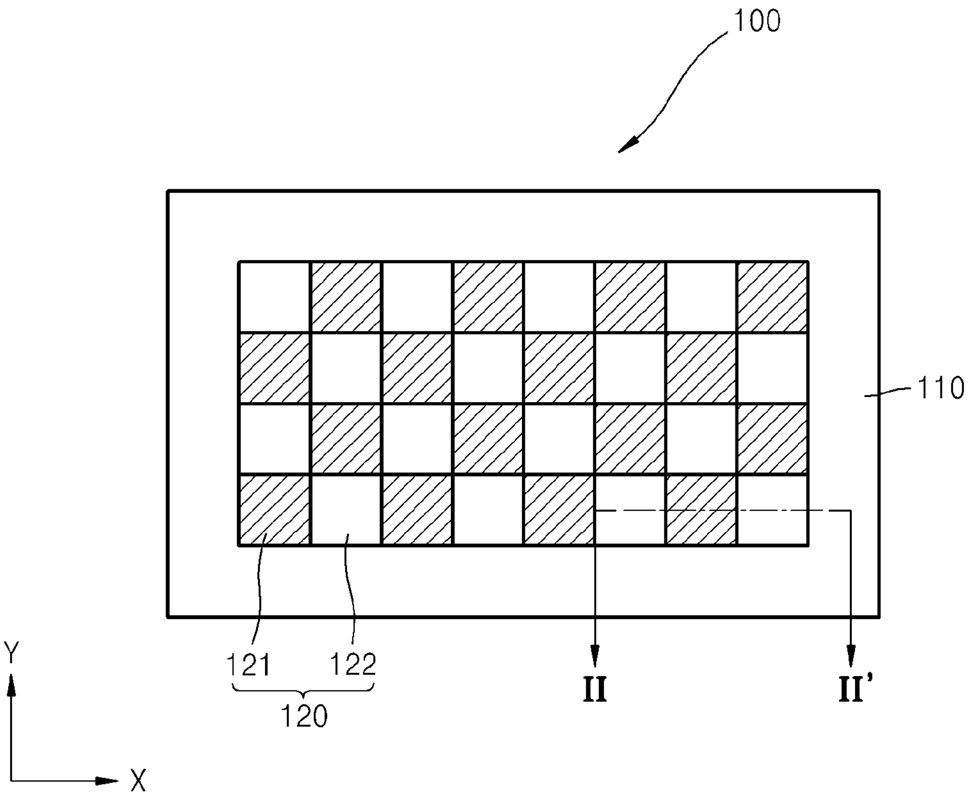
FIG. 1 is a plan view schematically illustrating a structure of an MUT array according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

As used herein, the term "and/or" includes any and all combinations of one or more of the associated listed items. Expressions such as "at least one of," when preceding a list of elements, modify the entire list of elements and do not modify the individual elements of the list.

FIG. 1 is a plan view schematically illustrating a structure of a micromachined ultrasonic transducer (MUT) array 100 according to an exemplary embodiment. Referring to FIG. 1, the MUT array 100 includes a plurality of MUT modules 120 tiled in an array on a printed circuit board 110. In FIG. 1, the MUT modules 120 are arranged in an array of 4×8. However, such an array is merely exemplary and the MUT array 100 may have a variety of m×n arrays on a printed circuit board 110, where m and n are natural numbers.

Figure 2:
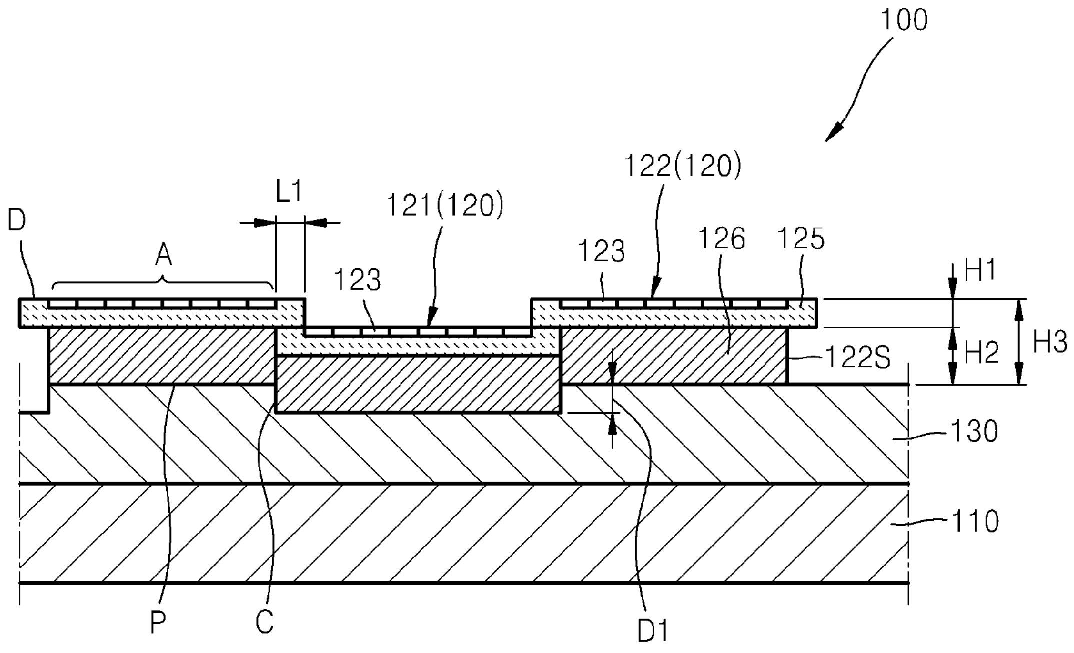
FIG. 2 is a cross-sectional view taken along line II-II' of FIG. 1.

FIG. 2 is a cross-sectional view taken along line II-II' of FIG. 1. Referring to FIGS. 1 and 2 together, an alignment plate 130 is arranged on a printed circuit board 110 and the MUT modules 120 are arranged on the alignment plate 130. A plurality of cavities C is formed in the alignment plate 130. A plurality of protruding portions P is formed between the neighboring cavities C in a row direction (X direction) and a column direction (Y direction). The protruding portion P may be an upper surface of the alignment plate 130 that is formed in a process of forming the cavities C in the upper surface of the alignment plate 130. It is understood that various configurations of different types of substrates (e.g., printed circuit boards, alignment plates, etc.) can be used according to other exemplary embodiments.

A first MUT module 121 is provided on one of the cavities C and a second MUT module 122 is provided on the protruding portion P. In FIG. 2, the bottom surface of the cavity C may have the same shape as that of a lower surface of the first MUT module 121. The width of the cavity C may be larger than that of the first MUT module 121 so that the first MUT module 121 may be easily inserted into the cavity C. For example, the width of the cavity C may be greater than a width of the first MUT module 121 by about 10-20 μm, but the exemplary embodiments are not limited thereto.

The first MUT module 121 and the second MUT module 122 may be respectively fixed to the cavity C and the protruding portion P by using an adhesive such as epoxy. The first MUT module 121 and the second MUT module 122 may be alternately arranged as illustrated in FIG. 1.

Each of the MUT modules 120 includes an application-specific integrated circuit (ASIC) 126 and an MUT 125 formed on the ASIC 126. The ASIC 126 may include circuit elements such as a high voltage pulser (HV Pulser), a preamplifier, and a transistor switch.

The MUT 125 may be a piezoelectric micromachined ultrasonic transducer (PMUT) or a capacitive micromachined ultrasonic transducer (CMUT), although is not limited thereto. The following description focuses on the CMUT.

The CMUT 125 includes a plurality of elements 123. An upper surface of each of the MUT modules 120 includes an active region A where the elements 123 are arranged and a dead region D surrounding the active region A. The active region A is where an ultrasonic wave is directly emitted from or where an ultrasonic wave is detected. The ultrasonic wave emitted from the active region A propagates through and exits out of the dead region D. The dead region D reduces the strength of the ultrasonic wave emitted from the active region A, and thus, in the dead region D, an ultrasonic wave having strength weaker than that of the ultrasonic wave in the active region A propagates and exits. Also, the active region A is where an ultrasonic wave input to the MUT array 100 is directly detected, whereas the dead region D is not where an external ultrasonic wave is directly detected. Thus, the dead region D reduces ultrasonic wave measurement sensitivity.

A depth D1 of the cavity C may be the same as a height H1 of the CMUT 125 as illustrated in FIG. 2. The height H1 of the CMUT 125 may be about one or several hundreds of micrometers. An edge portion of the ASIC 126 of the second MUT module 122 is removed and thus a step portion 122S is formed in the second MUT module 122. The sum of a height H2 of the step portion 122S and the depth D1 of the cavity C may be substantially the same as a height H3 of each of the MUT modules 120. In FIG. 2, the depth D1 of the cavity C and the height H1 of the CMUT 125 are the same. Accordingly, the edge portion of the ASIC 126 in the second MUT module 122 is completely removed. When the depth D1 of the cavity C is greater than the height H1 of the CMUT 125, only a part of the edge portion of the ASIC 126 is removed so that the step portion 122S may be formed.

The length of the dead region D between the neighboring first and second MUT modules 121 and 122 is the same as a length L1 of the dead region D of the second MUT module 122.

Figure 3:
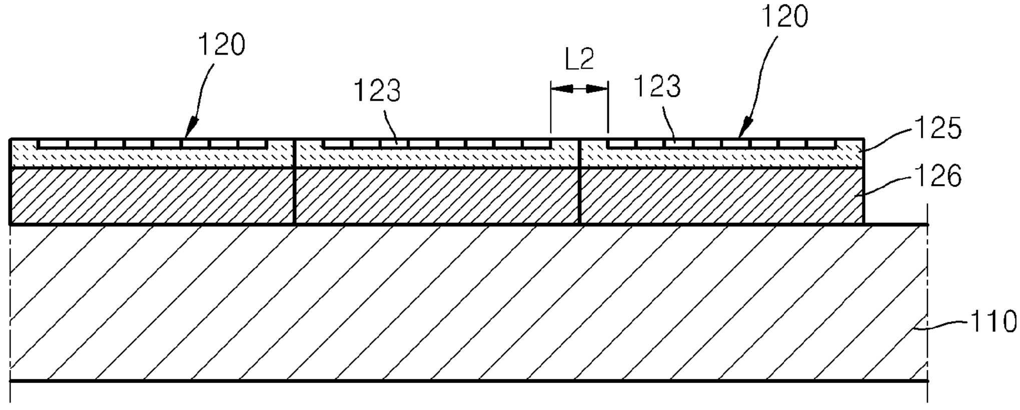
FIG. 3 is a cross-sectional view illustrating a general method of tiling MUT modules on a printed circuit board.

FIG. 3 is a cross-sectional view illustrating a general method of tiling MUT modules on a printed circuit board. For convenience of explanation, like reference numerals are used for constituent elements that are substantially the same as the constituent elements of FIG. 2, and detailed descriptions thereof will be omitted herein.

Referring to FIG. 3, the MUT modules 120 are arranged on an upper surface of the printed circuit board 110. In FIG. 3, since a length L2 of the dead region D where the neighboring MUT modules 120 overlap is more than double the length of the dead region D of one of MUT modules 120, the ultrasonic wave measurement sensitivity of the MUT array 100 is reduced.

In contrast, in the MUT array 100 according to the present exemplary embodiment, the length L1 of the dead region D where the neighboring MUT modules 120 overlap is the same as the length of the dead region D of one of the MUT modules 120. The length of the dead region D is reduced by about a half by using the cavity C of the alignment plate 130. Thus, the ultrasonic wave measurement sensitivity of the MUT array 100 according to exemplary embodiments is improved.

Figure 4:
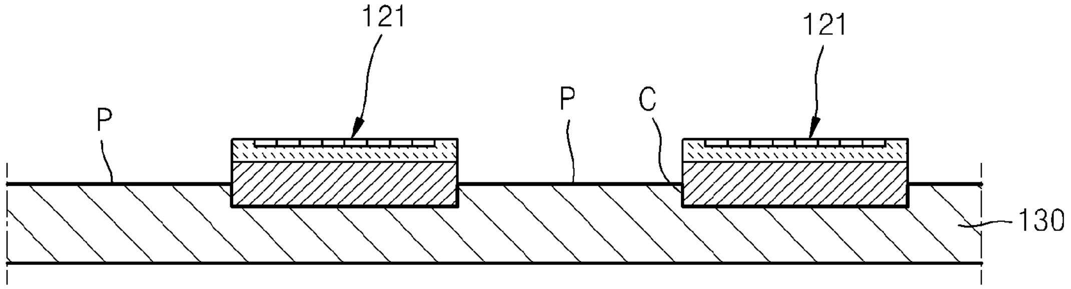
FIG. 4 is a cross-sectional view illustrating a method of tiling MUT modules on an alignment plate of FIG. 2.

Also, when the MUT modules 120 are tiled on the alignment plate 130, as illustrated in FIG. 4, the first MUT module 121 is seated on the cavity C and then the second MUT module 122 is arranged on the protruding portion P between the neighboring first MUT modules 121. Thus, accuracy in alignment is improved, that is, the second MUT module 122 is automatically aligned between the neighboring first MUT modules 121.

Figure 5:
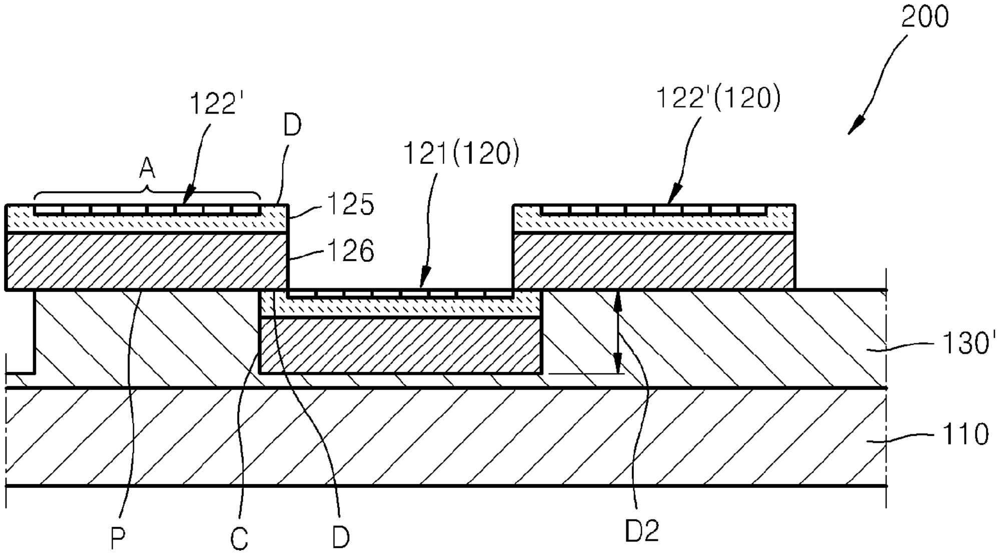
FIG. 5 is a cross-sectional view schematically illustrating a structure of an MUT array according to another exemplary embodiment.

FIG. 5 is a cross-sectional view schematically illustrating a structure of an MUT array 200 according to another exemplary embodiment. In the following description, like reference numerals are used for constituent elements that are substantially the same as the constituent elements of FIGS. 1 and 2, and detailed descriptions thereof will be omitted herein.

Referring to FIG. 5, the cavity C formed in an alignment plate 130' has a depth as deep as the thickness of the MUT module 120.

The width of the protruding portion P of the alignment plate 130' may be the same as the width of the active region A. Accordingly, the dead region D of a second MUT module 122' may be arranged in an overlapping fashion on the dead region D of the first MUT module 121 without forming the step portion 122S of FIG. 2 at the edge portion of the ASIC 126. Thus, the dead region D may be reduced in the MUT array 200.

Figure 6:
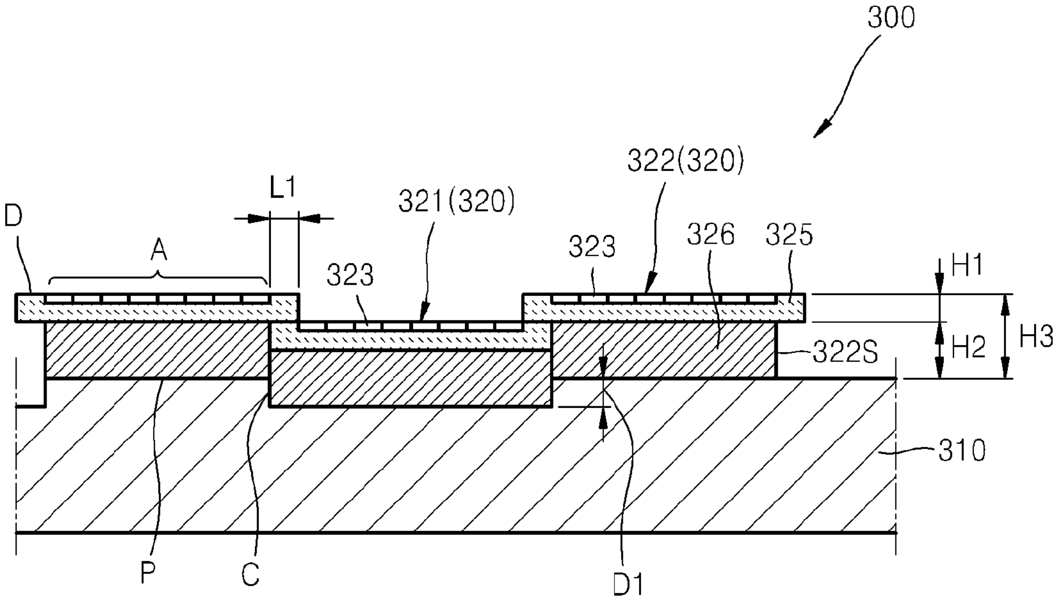
FIG. 6 is a cross-sectional view schematically illustrating a structure of an MUT array according to still another exemplary embodiment.

FIG. 6 is a cross-sectional view schematically illustrating a structure of an MUT array 300 according to still another exemplary embodiment. Since the plan view of the MUT array 300 may be substantially the same as the plan view of FIG. 1, the plan view of the MUT array 300 is omitted herein.

Referring to FIG. 6, the MUT array 300 includes a plurality of MUT modules 320 that are tiled in an array directly on a printed circuit board 310. In other words, the MUT array 300 does not have the alignment plate 130 of FIG. 2, as compared with the MUT array 100 of FIG. 2.

A plurality of cavities C is formed on the upper surface of the printed circuit board 310. Each of a plurality of protruding portions P is formed between the neighboring cavities C in the row direction (X direction of FIG. 1) and the column direction (Y direction of FIG. 1). The protruding portion P may be an upper surface of the printed circuit board 310 which is formed in a process of forming the cavities C on the upper surface of the printed circuit board 310. A first MUT module 321 is arranged in the cavity C and a second MUT module 322 is arranged on the protruding portion P. The cavity C may have a bottom surface having the same shape as a lower surface of the first MUT module 321. According to an exemplary embodiment, the width of the cavity C is greater than the width of the first MUT module 321 so that the first MUT module 321 may be easily inserted in the cavity C. For example, the width of the cavity C may be greater than the width of the first MUT module 321 by about 10-20 μm, but the exemplary embodiments are not limited thereto, and it is understood that the width may vary.

The first MUT module 321 and the second MUT module 322 may be respectively fixed to the cavity C and the protruding portion P by using an adhesive, such as epoxy. The first MUT module 321 and the second MUT module 322 may be alternately arranged.

The MUT module 320 includes a MUT 325 formed on an application-specific integrated circuit (ASIC) 326. The MUT 325 may be a piezoelectric micromachined ultrasonic transducer (PMUT) or a capacitive micromachined ultrasonic transducer (CMUT), although is not limited thereto. The following description focuses on the CMUT.

The CMUT 325 includes a plurality of elements 323. An upper surface of the MUT module 320 includes an active region A where the elements 323 are arranged and a dead region D surrounding the active region A. The active region A is where an ultrasonic wave is directly emitted from or where an ultrasonic wave is detected. The ultrasonic wave emitted from the active region A propagates through and exits out of the dead region D. The dead region D reduces the strength of the ultrasonic wave emitted from the active region A, and thus, in the dead region D, an ultrasonic wave having strength weaker than that of the ultrasonic wave in the active region A propagates and exits. Also, the dead region D is not where an external ultrasonic wave is directly detected.

The depth D1 of the cavity C may be the same as the height H1 of the CMUT 325 as illustrated in FIG. 6. The height H1 of the CMUT 325 may be about one or several hundreds of micrometers, although is not limited thereto. An edge portion of the ASIC 326 of the second MUT module 322 is removed and thus a step portion 322S is formed in the second MUT module 322. The sum of a height H2 of the step portion 322S and the depth D1 of the cavity C may be substantially the same as a height H3 of the MUT module 320. In FIG. 6, the depth D1 of the cavity C and the height H1 of the CMUT 325 are the same. Accordingly, the edge portion of the ASIC 326 in the second MUT module 322 is completely removed. When the depth D1 of the cavity C is greater than the height H1 of the CMUT 325, only a part of the edge portion of the ASIC 326 is removed so that the step portion 322S may be formed.

The length of the dead region D between the neighboring first and second MUT modules 321 and 322 is the same as a length L1 of the dead region D of the second MUT module 322.

According to the MUT array 300 of the present exemplary embodiment, the dead region D may be reduced by about ½ with respect to the active region A by using the cavity C of the printed circuit board 310. Thus, the ultrasonic wave measurement sensitivity of the MUT array 300 is improved.

Also, when the MUT modules 320 are tiled on the printed circuit board 310, first MUT modules 321 are seated in the corresponding cavities C and then the second MUT module 322 is arranged between the neighboring first MUT modules 321 so that accuracy in alignment is improved.

Figure 7:
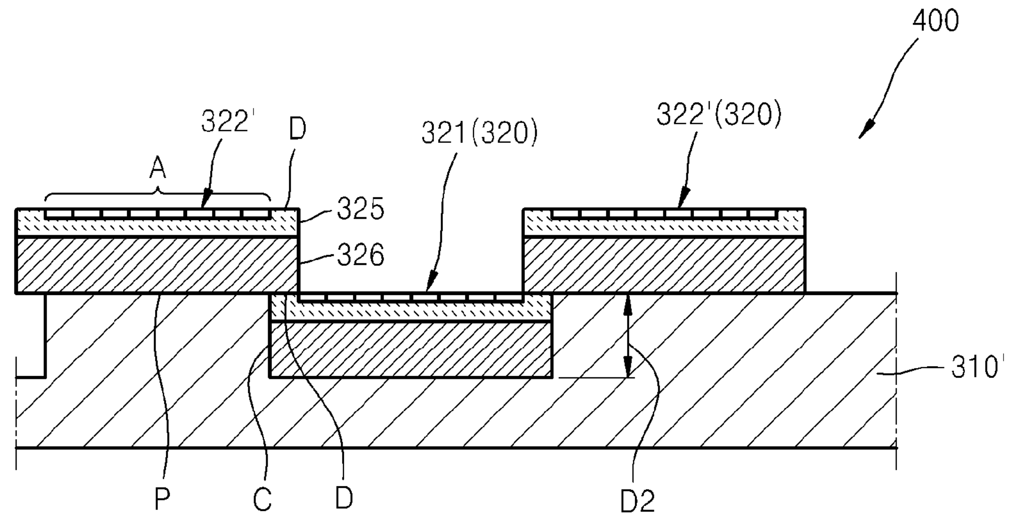
FIG. 7 is a cross-sectional view schematically illustrating a structure of an MUT array according to yet another exemplary embodiment.

FIG. 7 is a cross-sectional view schematically illustrating a structure of an MUT array 400 according to yet another exemplary embodiment. For convenience of explanation, like reference numerals are used for constituent elements that are substantially the same as the constituent elements of the MUT array 300 of FIG. 6, and detailed descriptions thereof will be omitted herein.

Referring to FIG. 7, the depth D2 of the cavity C formed in a printed circuit board 310' may be the same as the thickness of the CMUT module 320. The width of the protruding portion P of the printed circuit board 310 may be the same as the width of the active region A. Accordingly, the dead region D of a second CMUT module 322' may be arranged in an overlapping fashion on the dead region D of the first CMUT module 321 without forming the step portion 322S of FIG. 6 at the edge portion of the ASIC 326 of the second CMUT module 322'. Thus, the dead region D may be reduced in the MUT array 400.

According to the exemplary embodiments, the dead region D may be reduced by about ½ with respect to the active region A by using the cavity C of the alignment plate 130 or the printed circuit board 310. Thus, the ultrasonic wave measurement sensitivity of the MUT array is improved.

Also, during the tiling of the MUT modules, the first MUT module is fixed on the cavity C and then the second MUT module is automatically aligned on the protruding portion, thereby improving accuracy in the alignment process.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

What is claimed is:

1. A micromachined ultrasonic transducer (MUT) array comprising:

a printed circuit board;

an alignment plate formed on the printed circuit board, the alignment plate having a plurality of cavities formed therein and a plurality of protruding portions respectively formed between neighboring cavities of the plurality of cavities; and a plurality of MUT modules formed on the plurality of the cavities and the plurality of the protruding portions of the alignment plate, wherein each of the plurality of MUT modules comprises an application-specific integrated circuit (ASIC) arranged on the alignment plate and an MUT arranged on the ASIC.

2. The MUT array of claim 1, wherein the alignment plate is formed of any one of silicon, polymer, and ceramic.

3. The MUT array of claim 1, wherein the MUT is a capacitive micromachined ultrasonic transducer (CMUT) or a piezoelectric micromachined ultrasonic transducer (PMUT).

4. The MUT array of claim 1, wherein each of the plurality of cavities has a depth that is substantially the same as or greater than a thickness of the MUT.

5. The MUT array of claim 4, wherein each of the plurality of cavities has a depth that is substantially the same as a thickness of each of the plurality of MUT modules.

6. The MUT array of claim 1, wherein the plurality of MUT modules comprises a plurality of first MUT modules arranged on the plurality of the cavities and a plurality of second MUT modules arranged on the plurality of the protruding portions, each of the second MUT modules comprises a step portion formed by removing an edge portion of the ASIC, and an upper surface of each of the first MUT modules is configured to fit into the step portion of a corresponding second MUT module of the second MUT modules.

7. The MUT array of claim 6, wherein each of the first and second MUT modules comprises an active region where a plurality of elements for detecting an ultrasonic wave area are arranged and a dead region surrounding the active region, and an upper surface of each of the plurality of protruding portions has substantially the same size as the active region of each of the second MUT modules.

8. A micromachined ultrasonic transducer (MUT) array comprising:

a printed circuit board having a plurality of cavities formed thereon and a plurality of protruding portions respectively formed between neighboring cavities of the plurality of cavities; and a plurality of MUT modules formed on the plurality of cavities and the plurality of protruding portions, wherein each of the plurality of MUT modules comprises an application-specific integrated circuit (ASIC) arranged on the printed circuit board and an MUT arranged on the ASIC.

9. The MUT array of claim 8, wherein the MUT is a capacitive micromachined ultrasonic transducer (CMUT) or a piezoelectric micromachined ultrasonic transducer (PMUT).

10. The MUT array of claim 8, wherein each of the plurality of cavities has a depth that is substantially the same as or greater than a thickness of the MUT.

11. The MUT array of claim 10, wherein each of the plurality of cavities has a depth that is substantially the same as a thickness of each of the plurality of MUT modules.

12. The MUT array of claim 8, wherein the plurality of MUT modules comprises a plurality of first MUT modules arranged on the plurality of cavities and a plurality of second MUT modules arranged on the plurality of protruding portions, each of the second MUT modules comprises a step portion formed by removing an edge portion of the ASIC formed thereon, and an upper surface of the first MUT module is configured to fit into the step portion of a corresponding second MUT module of the second MUT modules.

13. The MUT array of claim 12, wherein each of the MUT modules comprises an active region where a plurality of elements for detecting an ultrasonic wave are arranged and a dead region surrounding the active region, and an upper surface of each of the plurality of protruding portions has substantially the same size as the active region of each of the second MUT modules.

14. A micromachined ultrasonic transducer (MUT) array comprising:

a substrate; and a plurality of MUT modules formed on a surface of the substrate, each of the MUT modules comprising an application-specific integrated circuit (ASIC) which contacts the surface of the substrate and an MUT formed on top of the ASIC, the MUT comprising a first central region and second regions at opposite ends of the first region;

wherein the plurality of MUT modules are arranged such that the second regions of neighboring MUTs overlap with each other.

15. The MUT array of claim 14, wherein the second regions of the neighboring MUTs overlap with each other in a direction which is substantially perpendicular to the surface of the substrate.

16. The MUT array of claim 14, wherein the first central region comprises an active region where an ultrasonic wave is emitted from or detected at, and the second regions comprise dead regions where the ultrasonic wave is not emitted from or detected at.

17. The MUT array of claim 14, wherein the substrate comprises a printed circuit board having the surface on which the plurality of MUT modules are formed.

18. The MUT array of claim 14, wherein the substrate comprises a printed circuit board and an alignment plate formed on the printed circuit board, the alignment plate having the surface on which the plurality of MUT modules are formed.

19. The MUT array of claim 14, wherein:

the substrate comprises a plurality of protruding portions which are separated from each other by cavities, the plurality of MUT modules comprises:

first MUT modules formed on the plurality of protruding portions, and second MUT modules formed on the cavities, and wherein:

second regions of MUTs of the first MUT modules are configured to overlap over a top surface of neighboring second regions of MUTs of the second MUT modules.

20. The MUT array of claim 14, wherein:

the plurality of MUT modules comprises first MUT modules and second MUT modules, a side portion of each of the first MUT modules is removed to form a step portion, and a side portion of each of the second MUT modules is fit into the step portion of a neighboring first MUT module.

* * * * *